(12) United States Patent
Usui et al.

(10) Patent No.: US 8,039,948 B2
(45) Date of Patent: Oct. 18, 2011

(54) DEVICE MOUNTING BOARD AND SEMICONDUCTOR APPARATUS USING THE SAME

(75) Inventors: Ryosuke Usui, Ichinomiya (JP); Takeshi Nakamura, Isesaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 1583 days.

(21) Appl. No.: 11/143,297

(22) Filed: Jun. 1, 2005

(65) Prior Publication Data
US 2005/0280148 A1    Dec. 22, 2005

(30) Foreign Application Priority Data
Jun. 1, 2004    (JP) .................................. 2004-163603

(51) Int. Cl.
*H01L 23/48* (2006.01)
(52) U.S. Cl. ................. 257/700; 257/734; 257/E21.502
(58) Field of Classification Search .................. 257/632, 257/700, 734, E21.502, E23.169
See application file for complete search history.

(56) References Cited

U.S. PATENT DOCUMENTS

| 6,323,435 B1 | 11/2001 | Strandberg et al. |
| 2003/0173676 A1 | 9/2003 | Horikawa |
| 2003/0213616 A1* | 11/2003 | Kusukawa et al. ............ 174/257 |

FOREIGN PATENT DOCUMENTS

| CN | 1444269 A | 9/2003 |
| CN | 1461181 A | 12/2003 |
| JP | 2000-44776 | 2/2000 |
| JP | 2002-84074 | 3/2002 |
| JP | 2002-094247 | 3/2002 |
| JP | 2002-521852 | 7/2002 |
| JP | 2002-268584 | 9/2002 |
| JP | 2003-133469 | 9/2003 |
| JP | 2003-298234 | 10/2003 |
| WO | WO 01/73510 | 10/2001 |

* cited by examiner

*Primary Examiner* — Roy K Potter
(74) *Attorney, Agent, or Firm* — Fish & Richardson P.C.

(57) ABSTRACT

A device mounting board for a device to be mounted on, comprising: a substrate; and a laminated film composed of a plurality of insulating layers formed on one side of the substrate. Here, any of the second and subsequent insulating layers from the substrate is a photosolder resist layer containing a cardo type polymer. The photosolder resist layer has a thickness smaller than that of the insulating resin film arranged between the photosolder resist layer and the substrate.

20 Claims, 13 Drawing Sheets

DEVICE MOUNTING BOARD AND SEMICONDUCTOR APPARATUS USING THE SAME

BACKGROUND OF THE INVENTION

1. Field of the Invention

The invention relates to a device mounting board and a semiconductor apparatus using the same.

2. Description of the Related Art

Portable electronics equipment including cellular phones, PDAs, DVCs, and DSCs has been advancing at increasingly fast speed. Under the circumstances, miniaturization and weight saving have become essential in order for these products to be accepted in the market. For the sake of achieving this, system LSIs of higher integration have been sought after. Meanwhile, enhanced usability and convenience have been desired of such electronics equipment, and functional and performance sophistication has been required of the LSIs to be used for the equipment. Consequently, while the LSI chips of higher integration have grown in the numbers of I/Os, miniaturization has been highly required of the packages themselves. For the sake of satisfying both the requirements, there has been a strong demand to develop a semiconductor package suited to packaging semiconductor parts on a board at a higher density. To meet this demand, various types of packaging technologies called CSP (Chip Size Package) have been developed.

Among the known examples of such packages is a BGA (Ball Grid Array). In the BGA, semiconductor chips are mounted on the packaging board and molded with a resin before solder balls are formed over an area on the other side of the board as external terminals. Since the BGA achieves the mounting area on a plane, it is relatively easy to miniaturize the package. Besides, the circuit board need not be rendered in narrower pitches, which eliminates the need for high-precision mounting technologies. The BGA can thus be used to reduce the total packaging cost even when the package itself costs relatively high.

FIG. 12 is a diagram showing the general configuration of a typical BGA. The BGA 100 is configured so that an LSI chip 102 is mounted on a glass epoxy board 106 via an adhesive layer 108. The LSI chip 102 is molded with a sealing resin 110. The LSI chip 102 and the glass epoxy board 106 are electrically connected with metal wires 104. Solder balls 112 are arranged in an array on the backside of the glass epoxy board 106. Through these solder balls 112, the BGA 100 is mounted on a printed wiring board.

Another example of CSP appears in Japanese Patent Laid-Open Publication No. 2002-94247. This publication has disclosed a system-in-package for a high-frequency LSI to be mounted on. This package comprises a base board, or a core board having a multilayer wiring structure formed thereon. Semiconductor devices including a high-frequency LSI are formed on the base board. The multilayer wiring structure is a laminated structure of the core board, a copper foil accompanied with an insulating resin layer, and the like.

The conventional technology described in the foregoing publication, however, has been susceptible to the following improvement. That is, when such a device mounting board as the base board described above includes a multilayer insulating film, the individual insulating resin layers in the multilayer insulating film may have different thicknesses, different coefficients of thermal expansion, etc. Then, the insulating resin layers in the multilayer insulating film can differ from each other in the degree of expansion and contraction due to heat cycles or the like when the semiconductor apparatus is under fabrication or in use.

As a result, there can occur a drop in adhesiveness between the insulating resin layers of the multilayer insulating film, or exfoliation of the layers. In other cases, the device mounting board can cause warpage, which might deteriorate the position accuracy and cause a drop in yield when semiconductor devices are connected by such connection methods as flip-chip and wire-bonding. Moreover, in conventional device mounting boards, the insulating layers must have large thicknesses for the sake of solving the warpage and other problems. It has thus been difficult to reduce the thicknesses and sizes of the device mounting boards.

SUMMARY OF THE INVENTION

The present invention has been achieved in view of the foregoing circumstances. It is thus an object of the present invention to stably provide a device mounting board which has a reduced thickness and size, has high reliability and heat resistance, and allows excellent position accuracy in mounting a semiconductor device.

The present invention provides a device mounting board for a device to be mounted on, comprising: a substrate; and a laminated film composed of a plurality of insulating layers formed on one side of the substrate. Here, any of second and subsequent insulating layers from the substrate contains a cardo type polymer. The insulating layer containing the cardo type polymer has a thickness smaller than that of the insulating layer arranged between the insulating layer containing the cardo type polymer and the substrate.

The cardo type polymer has excellent mechanical strength, heat resistance, and a low coefficient of thermal expansion since its bulky substituents hinder movement of the main chain. This suppresses a drop in adhesiveness between the individual insulating layers in the laminated film of the device mounting board, exfoliation of the layers, or the like ascribable to heat cycles. It is therefore possible to stably provide a device mounting board of high reliability and heat resistance.

Since the insulating layer containing the cardo type polymer has the thickness smaller than that of the insulating layer arranged between the insulating layer containing the cardo type polymer and the substrate, it is possible to reduce the thickness and size of the device mounting board. The insulating layer containing the cardo type polymer has excellent insulation and exposure performance, high rigidity, and a low coefficient of thermal expansion. The insulating layer, even if thinner than the insulating layer arranged closer to the substrate, can thus fix the entire device mounting board and suppress warpage of the entire device mounting board. This makes it possible to provide a device mounting board that allows excellent position accuracy in mounting a semiconductor device.

Up to this point, the configurations of the present invention have been described. It is intended, however, that any combinations of these configurations also constitute applicable aspects of the present invention. Moreover, any conversions of the expressions of the present invention into other categories, such as a method of manufacturing the device mounting board and a semiconductor apparatus having the device mounting board, are also intended to constitute applicable aspects of the present invention.

Incidentally, as employed in the present invention, the device mounting board shall refer to a board on which semiconductor devices such as an LSI chip and an IC chip, active devices such as a transistor and a diode, passive devices such as a resistor, a coil, and a capacitor, and/or other components are to be mounted. One example is an interposer board of an ISB™ structure to be described later. The device mounting board may include a rigid core board such as a silicon board, whereas a coreless structure having a multilayer insulating film composed of insulating resin films with no core board is also applicable.

As employed in the present invention, the external terminals shall refer to terminals capable of connection with an external device, board, or the like. Among the examples are electrode pads and solder balls. It is understood that these examples are not restrictive, and part of wiring or part of other conductive members capable of connection with an external device, board, or the like may also be used.

Semiconductor devices such as an LSI chip and an IC chip may be mounted on the surface of the foregoing device mounting board by such connection methods as flip-chip connection and wire-bonding connection. In any of the connection methods, the foregoing device mounting board can be used to mount the semiconductor devices with favorable position accuracy.

DETAILED DESCRIPTION OF THE INVENTION

Figure 1:
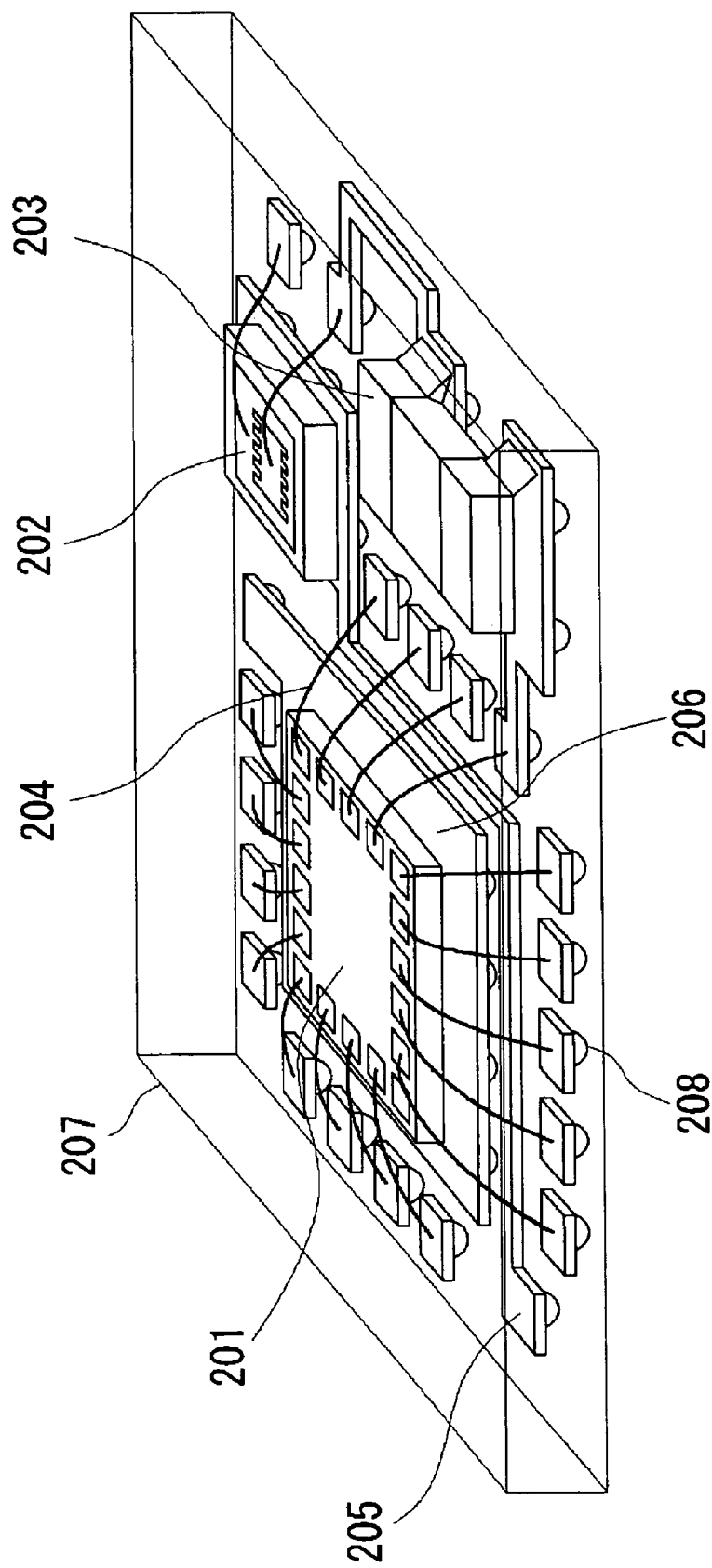
FIG. 1 is a diagram for explaining the structure of an ISB™.

In the present invention, the insulating layer containing the cardo type polymer (when necessary, abbreviated as cardo type polymer containing resin film) may be an insulating film for a conductive member to be embedded in.

In general, when a laminated film is provided with wiring inside, the wiring density may often vary layer by layer. This facilitates causing a drop in adhesiveness between the individual insulating resin layers in the laminated film of the device mounting board, exfoliation of the layers, warpage of the device mounting board, or the like because of heat cycles.

According to the present invention, however, a first insulating layer having a thickness smaller than that of a second insulating layer contains a cardo type polymer. The cardo type polymer has high rigidity and a low coefficient of thermal expansion. Since the first insulating layer is made thinner than the second insulating layer, the device mounting board can be reduced in thickness and size. In addition, even when the wiring density varies layer by layer, the first insulating layer can fix the entire multilayer insulating film. This suppresses a drop in adhesiveness between the individual insulating resin layers, exfoliation of the layers, warpage of the device mounting board, etc.

The insulating layer containing the cardo type polymer may be a solder resist layer.

As will be described, the cardo type polymer provides excellent resolution. The insulating layer can thus be made in a greater thickness while suppressing a drop in resolution, so that it can be used suitably as a solder resist layer. That is, even with greater thicknesses, solder ball forming holes for forming solder balls can be maintained at preferable position accuracy.

Moreover, the cardo type polymer may be a cross-linked polymer having a carboxylic acid group and an acrylate group in the same molecular chain.

According to this configuration, the cardo type polymer is a polymer of chemically cross-linked type, having both the developable carboxylic acid group and the acrylate group, or the cross-linker group, in the same molecular chain. It also has a bulky substituent in its main chain, and thus is less prone to radical diffusion. Consequently, the cardo type polymer makes a photo-curing polymer having high resolution. In this case, ultraviolet rays (UV) or heat is applied to the polymer so that the acrylate group is cross-linked into an acryl group for polymer exposition and development.

The insulating layer containing the cardo type polymer may have a glass transition temperature in the range of 180° C. to 220° C.

According to this configuration, an insulating film having excellent heat resistance can be obtained stably. It is therefore possible to provide a semiconductor apparatus of excellent reliability under high-temperature conditions.

The insulating layer containing the cardo type polymer may also have a coefficient of thermal expansion in the range of 50 to 80 ppm/° C.

Here, the insulating layer containing the cardo type polymer may contain fillers such as fibers. The examples of available fillers include particulate or fibrous $SiO_2$ or SiN. In this case, it is possible to obtain an insulating layer made of a resin composition having a coefficient of thermal expansion of 20 ppm/K or below.

According to this configuration, it is possible to obtain the insulating film stably while suppressing a drop in adhesiveness with other members due to heat cycles. Consequently, it is possible to provide a semiconductor apparatus having excellent reliability and manufacturing stability.

The insulating layer containing the cardo type polymer may have a dielectric loss tangent in the range of 0.001 to 0.04 when an alternating electric field having a frequency of 1 MHz is applied thereto.

According to this configuration, the insulating film has excellent dielectric characteristics including high-frequency characteristics. It is therefore possible to provide a semiconductor apparatus having excellent dielectric characteristics on the whole.

Now, the device mounting board according to the present invention may further comprise a second laminated film composed of a plurality of insulating layers formed on the other side of the substrate. In the second laminated film, any of the second and subsequent insulating layers from the substrate contains a cardo type polymer. The insulating layer containing the cardo type polymer has a thickness smaller than that of the insulating layer(s) arranged between the insulating layer containing the cardo type polymer and the substrate.

According to this configuration, the insulating layers containing the cardo type polymer fix the entire device mounting board from both sides. This allows a reduction in the thickness and size of the device mounting board, along with an improvement to the effect of suppressing a drop in adhesiveness between the individual insulating resin layers, exfoliation of the layers, warpage of the device mounting board, or the like.

The present invention also provides a semiconductor apparatus comprising: the device mounting board; and a semiconductor device mounted on the device mounting board.

According to this configuration, the semiconductor device is connected onto the warpage-suppressed device mounting board of reduced thickness and size, by such connection methods as flip-chip connection and wire-bonding connection. This means improved position accuracy in mounting the semiconductor device.

The insulating layer containing the cardo type polymer preferably is one which contains the cardo type polymer as a base material. For example, the content of the cardo type polymer may be 30% or higher by mass. It is particularly preferable to contain the cardo type polymer at or above 50% by mass. This range of contents can achieve the foregoing properties stably.

Hereinafter, embodiments of the present invention will be described with reference to the drawings. Incidentally, in any of the drawings, the same components will be designated by identical reference numbers. Description thereof will be omitted as appropriate.

Initially, description will be given of an ISB structure to be used for semiconductor apparatuses according to the respective embodiments to be described later. An ISB (Integrated System in Board™) is an original package developed by practitioners and others of the assignee. The ISB is one for packaging electronic circuits chiefly including semiconductor bare chips. It is an original coreless system in package in which copper wiring patterns are realized without using cores to support circuit components.

FIG. 1 is a schematic block diagram showing an example of ISB. For the sake of easy understanding of the entire ISB structure, only a single wiring layer is shown here. In fact, a plurality of wiring layers are laminated in the structure. This ISB is configured so that an LSI bare chip 201, a Tr bare chip 202, and a chip CR 203 are connected with wiring made of a copper pattern 205. The LSI bare chip 201 is connected to lead electrodes and wires by gold wire bonding 204. Arranged immediately below the LSI bare chip 201 is a conductive paste 206, through which the ISB is mounted on a printed wiring board. The entire ISB is sealed by a resin package 207 which is made of epoxy resin or the like.

This package provides the following advantages:
(i) Because of the coreless packaging, the transistors, ICs, and LSIs can be reduced in size and thickness;
(ii) Since the circuits of transistors, system LSIs, and even chip-type capacitors and resistors can be formed into a package, it is possible to achieve a sophisticated SIP (System in Package);
(iii) Existing semiconductor devices can be combined to develop a system LSI in a short period;
(iv) The semiconductor bare chip is mounted directly on the copper material immediately below. This allows favorable heat radiation;
(v) The circuit wiring is achieved by the copper material without any core member. This lowers the permittivity of the circuit wiring, thereby allowing excellent properties for high-speed data transfer and high-frequency circuits; (vi) The structure that the electrodes are embedded in the package can suppress the occurrence of particle contamination of the electrode material;
(vii) The free package size can reduce the amount of material to be discarded per piece to approximately $\frac{1}{10}$ as compared to that of a 64-pin SQFP package. Environmental burdens can thus be lowered;
(viii) The concept of the system configuration can be renewed from a printed circuit board for bearing components to a circuit board having functionality; and
(ix) The ISB pattern can be designed easily as is the case with the pattern of a printed circuit board. This allows engineers in set makers to design by themselves.

Figure 2B:
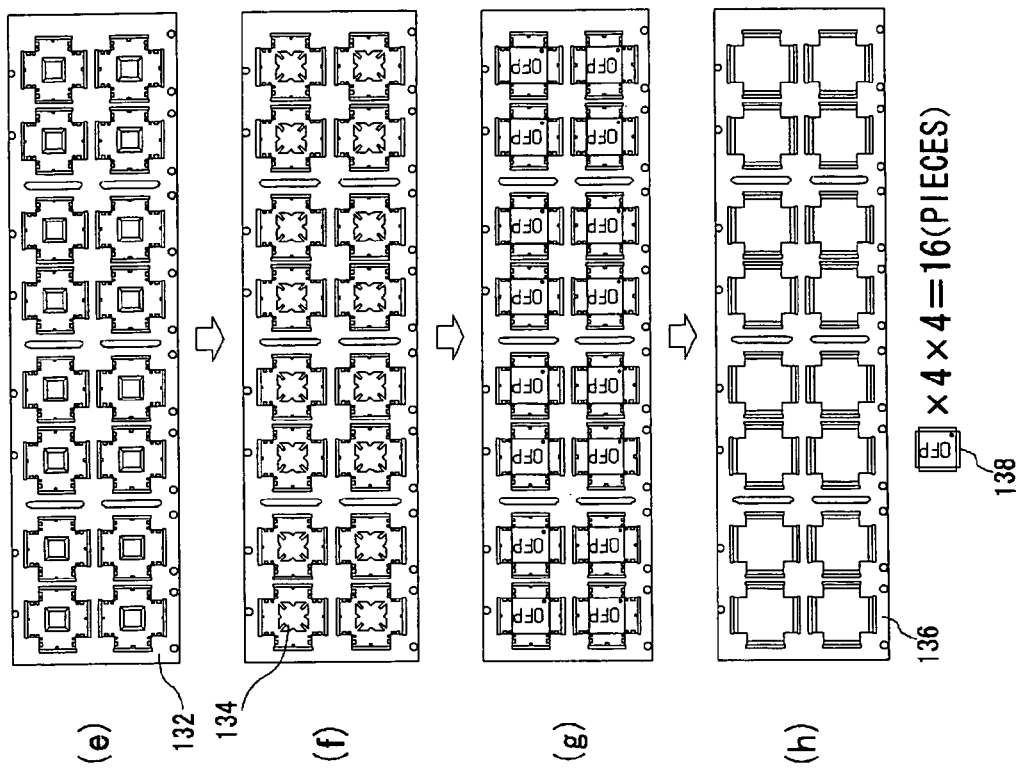
FIG. 2B is a diagram for explaining the manufacturing process of a CSP.
Figure 2A:
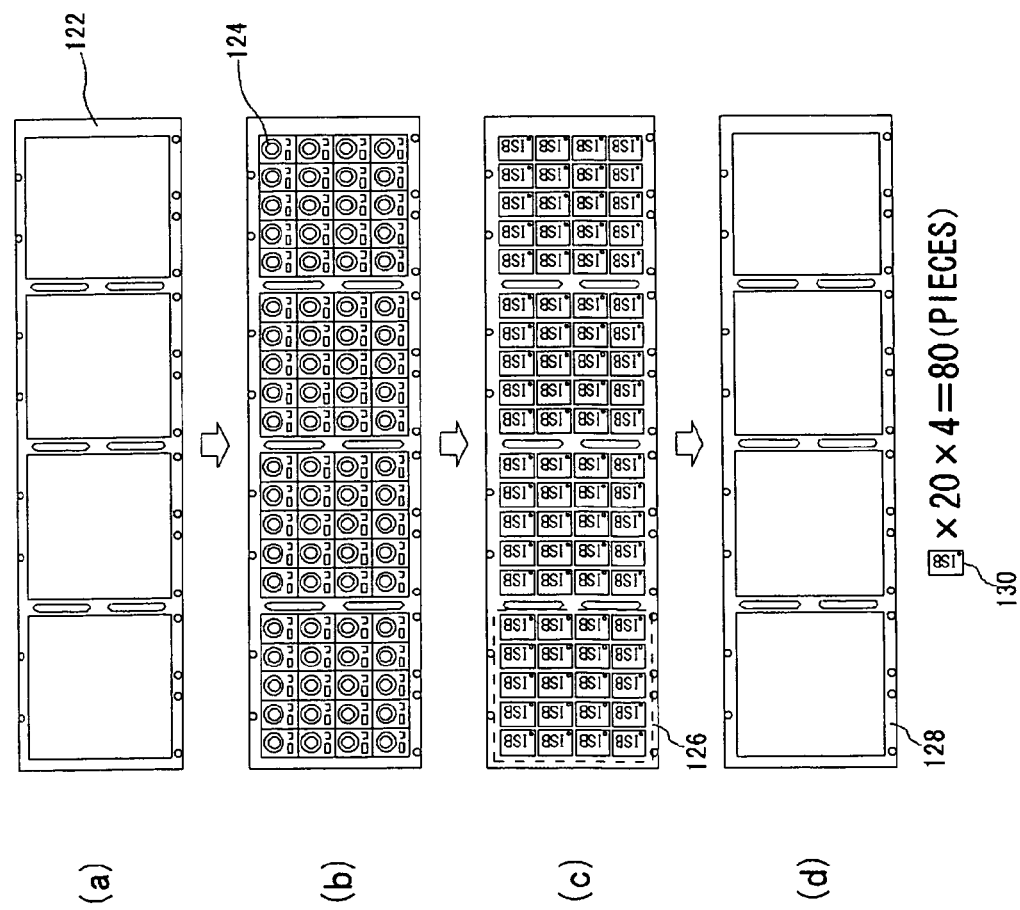
FIG. 2A is a diagram for explaining the manufacturing process of an ISB™.

Next, description will be given of the merits of the ISB manufacturing process. FIGS. 2A and 2B are diagrams for comparing the manufacturing processes of a conventional CSP and an ISB according to the present invention.

FIG. 2B shows the manufacturing process of a conventional CSP. Initially, a frame 132 is formed on a base board. Chips 134 are mounted on respective device forming regions defined by the frame. Then, the devices are individually packaged with thermosetting resin. Subsequently, the devices are die-stamped into respective products 138. In the final step of stamping, both the mold resin and the base board are cut at the same time. This may sometimes cause rough cut surfaces. Besides, the stamping can also produce a large amount of discarded material 136, which is problematic in terms of environmental burdens.

FIG. 2A is a diagram showing the ISB manufacturing process. Initially, a frame 122 is formed on a metal foil. Wiring patterns are formed in respective module forming regions, and circuit devices such as an LSI are mounted thereon. Subsequently, the modules are individually packaged to form a frame 122 having a plurality of ISB basic blocks 126. Then, the frame is diced along the scribed areas, thereby obtaining products 130. Here, after the completion of the packaging, the underlying metal foil is removed before the scribing step. The dicing in the scribing step is thus intended to cut the resin layer alone. This can suppress rough cut surfaces and allow improved dicing accuracy. Moreover, the ISB manufacturing process produces only a small amount of discarded material 128, which is advantageous in terms of environmental burdens.

Embodiment 1

Figure 10A:
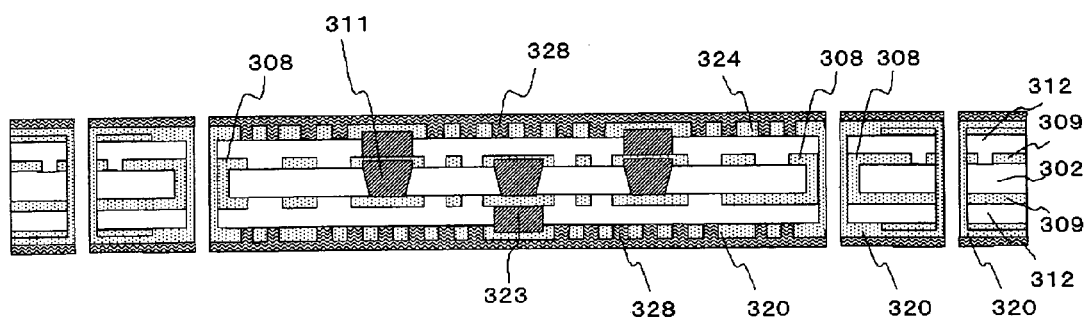
FIGS. 10A and 10B are sectional views showing the steps of manufacturing the device mounting board according to the embodiment.
Figure 10B:
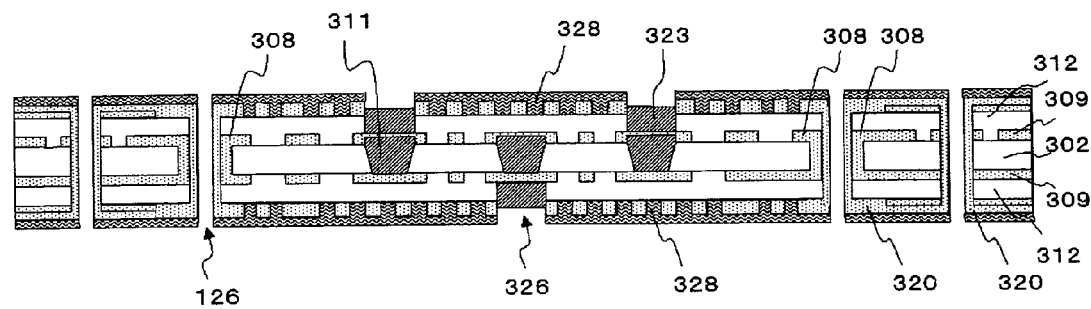

FIG. 10B is a sectional view showing a device mounting board having a four-layer ISB structure according to the present embodiment. The device mounting board according to the present embodiment is configured so that an insulating resin film 312 and a photosolder resist layer 328 are laminated in this order on the top surface of a substrate 302. Moreover, an insulating resin film 312 and a photosolder resist layer 328 are also laminated in this order on the bottom surface of the substrate 302.

The substrate 302, the insulating resin films 312, and the photosolder resist layers 328 are pierced by through holes 126.

Wiring made of a copper film 308, wiring made of a copper film 320, vias 311, and the like are partly embedded in the substrate 302. The wiring made of the copper film 308, the wiring made of the copper film 320, the vias 311, vias 323, and the like are partly embedded in the insulating resin films 312. The wiring made of the copper film 320, the vias 323, and the like are partly embedded in the photosolder resist layers 328. Openings 326 are also made in the photosolder resist layers 328.

Here, the material of the substrate 302 is not particularly limited to a glass epoxy board. Any material may be used as long as it has appropriate rigidity. For example, the substrate 302 may be made of a resin board, a ceramic board, or the like. More particularly, a substrate having a low permittivity is suitably used for the sake of excellent high-frequency characteristics. Namely, the available materials include polyphenylethylene (PPE), bismaleimide triazine (BT-resin), polytetrafluoroethylene (Teflon™), polyimides, liquid crystal polymers (LCP), polynorbornene (PNB), epoxy-based resins, acryl-based resins, ceramics, and mixtures of ceramics and organic materials.

The insulating resin films 312 are made of a resin material which softens by heat. The resin material shall be capable of forming the insulating resin films 312 in a considerably smaller thickness. A resin material having a low permittivity and excellent high-frequency characteristics is suitably used in particular.

Here, the insulating resin films 312 may contain fillers such as fibers. The examples of available fillers include particulate or fibrous $SiO_2$ or SiN.

The photosolder resist layers 328 contain a cardo type polymer. In addition, the photosolder resist layer 328 have a thickness smaller than those of the insulating resin films 312.

Here, the cardo type polymer has excellent mechanical strength, heat resistance, and a low coefficient of thermal expansion because its bulky substituents hinder movement of the main chain. This precludes the substrate 302, the insulating resin films 312, and the photosolder resist layers 328 from dropping in adhesiveness or causing exfoliation therebetween because of heat cycles. Consequently, the device mounting board according to the present embodiment improves in reliability and heat resistance.

The photosolder resist layers 328 containing the cardo type polymer has a thickness smaller that those of the insulating resin films 312 which are interposed between the photosolder resist layers 328 and the substrate 302. The device mounting board are thus reduced in thickness and size while the photosolder resist layers 328 fix the entire device mounting board and suppress warpage of the entire device mounting board. This improves the position accuracy in mounting semiconductor devices on the device mounting board according to the present embodiment.

As will be described, the cardo type polymer provides excellent resolution. The photosolder resist layers 328 can thus be made in greater thicknesses while suppressing a drop in resolution, so that they can be used suitably as solder resist layers. More specifically, even when the photosolder resist layers 328 are given a thickness smaller than those of the insulating resin films 312, the openings 326 to be used as solder ball forming holes in forming solder balls can be maintained at favorable position accuracy.

The multilayer wiring structure including the wiring made of the copper film 308, the wiring made of the copper film 320, the wiring 309, the vias 311, and the vias 323 is not limited to copper wiring. For example, aluminum wiring, aluminum alloy wiring, copper alloy wiring, wire-bonded gold wiring, gold alloy wiring, or wiring made of a mixture of these may also be used.

Active devices such as a transistor and a diode, and passive devices such as a capacitor and a resistor, may also be arranged on the surface of or inside the four-layer ISB structure described above. These active or passive devices may be connected to the multilayer wiring structure in the four-layer ISB so that they can be connected to external conductive members through the vias 323 or the like.

FIGS. 3A to 10B are sectional views showing the steps of manufacturing a device mounting board having the four-layer ISB structure according to the present embodiment.

Figure 3A:
FIGS. 3A and 3B are sectional views showing the steps of manufacturing a device mounting board according to an embodiment.

To manufacture the device mounting board having the four-layer ISB structure according to the present embodiment, a substrate 302 made of a glass epoxy board or the like is prepared initially. As shown in FIG. 3A, copper foils 304 are bonded to the substrate 302, and holes having a diameter of around 150 μm are drilled therein. Here, the substrate 302 has a thickness of around 37.5 μm to 42.5 μm, for example. The copper foils 304 have a thickness of around 10 μm to 15 μm, for example.

Aluminum foils may be used instead of the copper foils 304. Otherwise, copper alloy foils, aluminum alloy foils, or the like may also be used. Instead of the conductive members containing copper, conductive members containing other metals such as aluminum or alloys thereof may be used.

Figure 3B:
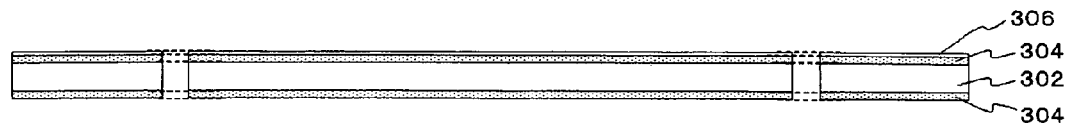

Next, as shown in FIG. 3B, a photoetching resist layer 306 is laminated on the top surface of one of the copper foils 304.

Figure 4A:
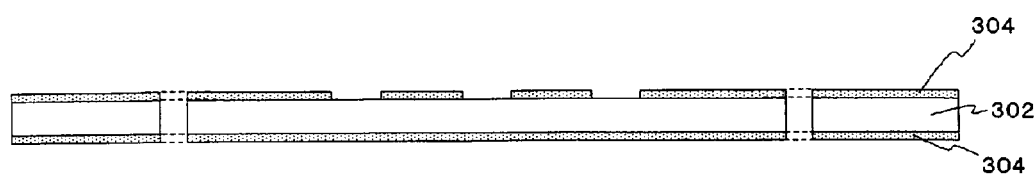
FIGS. 4A, 4B, and 4C are sectional views showing the steps of manufacturing the device mounting board according to the embodiment.

Although not shown, the photoetching resist layer 306 is then patterned through exposure by using a glass plate having shielding areas as a mask. Subsequently, as shown in FIG. 4A, the copper foil 304 is patterned by using the photoetching resist layer 306 as a mask.

Figure 4B:
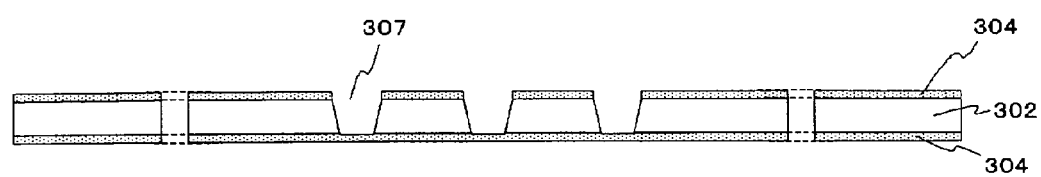

Then, as shown in FIG. 4B, the substrate 302 is patterned by using the photoetching resist layer 306 as a mask. This forms via holes 307 having a diameter of around 150 μm, for example.

In the present embodiment, the via holes 307 are formed by solution-based chemical etching. Alternatively, other methods such as machining, plasma-based dry etching, and laser processing may be used. After the etching, the photoetching resist layer 306 is removed.

Figure 4C:
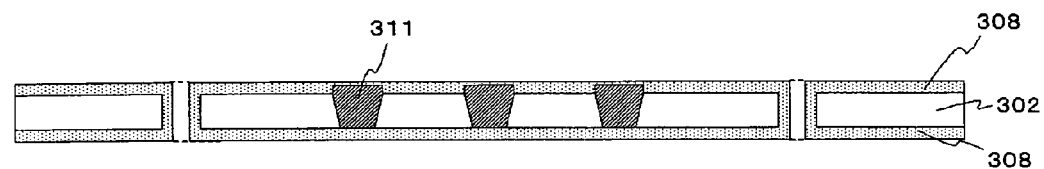

Next, as shown in FIG. 4C, the interiors of the via holes 307 are roughened and cleaned by wet processing. Subsequently, electroless plating capable of high aspect ratios is conducted, followed by electrolytic plating. This fills the via holes 307 with conductive material, thereby forming the vias 311. Then, the copper film 308 is formed all over.

The vias 311 can be formed, for example, in the following manner. Initially, a thin film of around 0.5 to 1 μm is formed by electroless copper plating. Then, a film of approximately 20 μm or so is formed by electrolytic plating. The electroless plating often uses palladium as a catalyst. To make the electroless plating catalyst adhere to a flexible insulating resin, a palladium complex is mixed into an aqueous solution, and the flexible insulating substrate is immersed therein to make the palladium complex adhere to the surface. In that state, a reducing agent is added to reduce the complex into metal palladium, whereby the core for starting plating can be formed on the surface of the flexible insulating substrate.

Figure 5A:
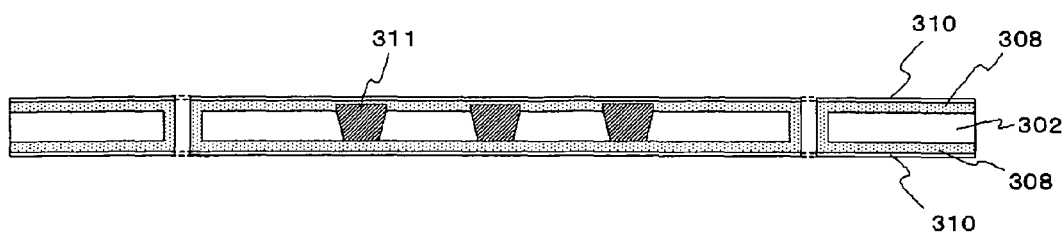
FIGS. 5A and 5B are sectional views showing the steps of manufacturing the device mounting board according to the embodiment.

Next, as shown in FIG. 5A, photoetching resist layers 310 are laminated on the top and bottom surfaces of the copper film 308. Although not shown, the photoetching resist layers 310 are then patterned through exposure by using glass plates having shielding areas as masks.

Figure 5B:
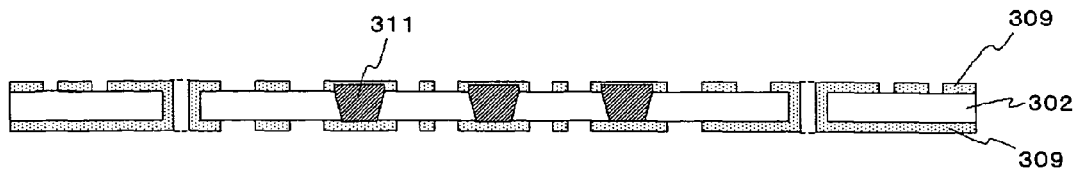

Subsequently, as shown in FIG. 5B, the copper film 308 made of the copper plating layer is etched by using the photoetching resist layers 310 as masks. As a result, copper wiring 309 is formed. The copper wiring 309 is formed, for example, by spraying a chemical etchant onto the areas exposed from the resists so that the unnecessary portions of the copper plating are etched off. After the etching, the photoetching resist layers 310 are removed.

Figure 6A:
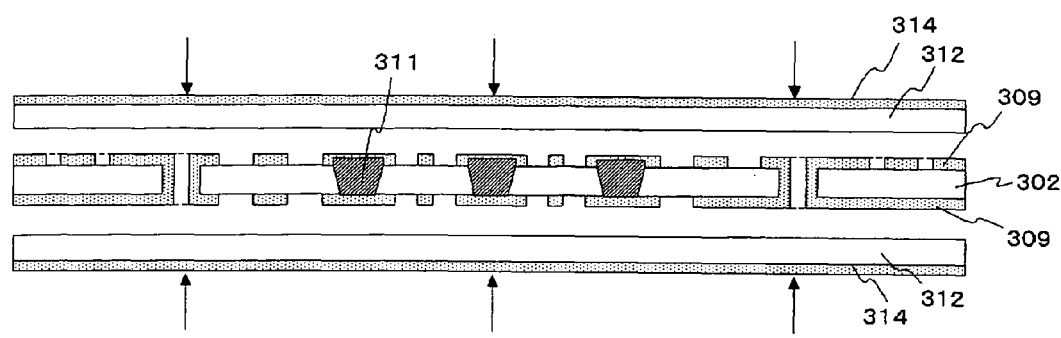
FIGS. 6A, 6B, and 6C are sectional views showing the steps of manufacturing the device mounting board according to the embodiment.

Next, as shown in FIG. 6A, insulating resin films 312, or resin films accompanied with copper foils 314, are bonded to both sides of the wiring 309. Here, the resin films for forming the insulating resin films 312 have a thickness of around 35 µm to 50 µm, for example. The copper foils 314 have a thickness of around 10 µm to 15 µm, for example.

Figure 6B:
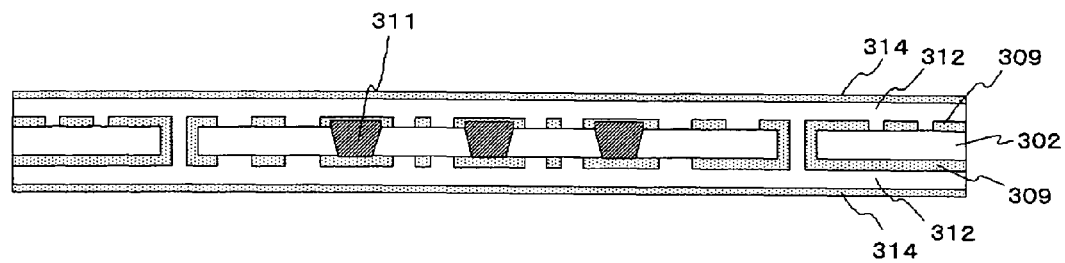

For the sake of bonding, the insulating resin films 312 accompanied with the copper foils are put into contact with the substrate 302 and the wiring 309, and then the substrate 302 and the wiring 309 are forced into the insulating resin films 312. Next, as shown in FIG. 6B, the insulating resin films 312 are heated under vacuum or under reduced pressure so that they adhere to the substrate 302 and the wiring 309.

Incidentally, the insulating resin films 312 need not necessarily be formed by adhesion. For example, they may be formed by applying and drying a liquid resin composition. More specifically, the insulating resin films 312 may be formed by spin coating, curtain coating, roll coating, dip coating, or other methods having excellent application uniformity, thickness controllability, etc. In this case, the copper foils may be formed separately after the formation of the insulating resin films 312.

Figure 6C:
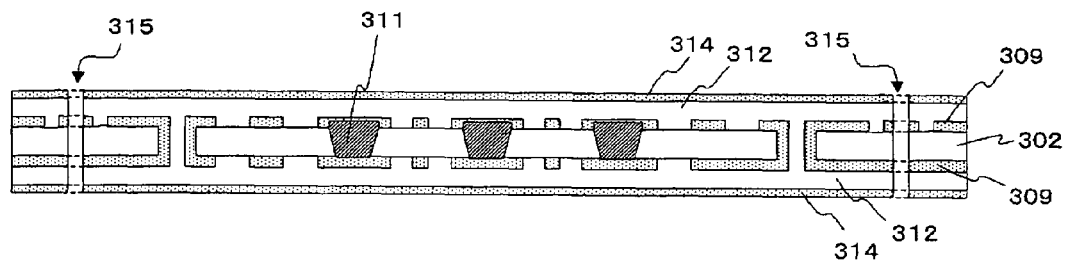

Then, as shown in FIG. 6C, the copper foils 314 are irradiated with X rays. Holes 315 piercing through the copper foils 314, the insulating resin films 312, the wiring 309, and the substrate 302 are thus formed. Alternatively, the holes 315 may be formed by laser irradiation or drilling.

Figure 7A:
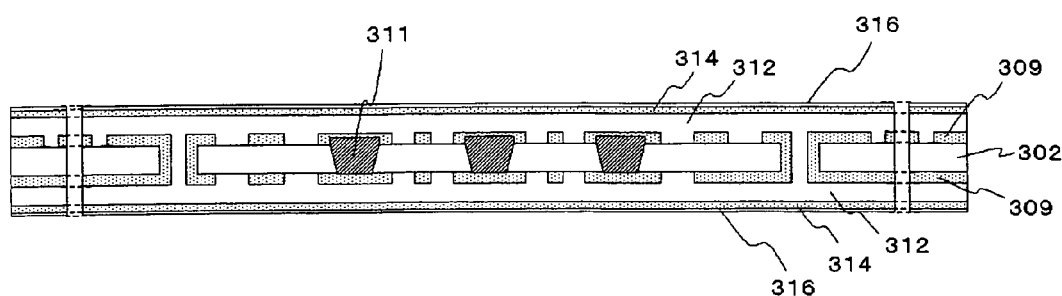
FIGS. 7A and 7B are sectional views showing the steps of manufacturing the device mounting board according to the embodiment.

Subsequently, as shown in FIG. 7A, photoetching resist layers 316 are laminated on the top and bottom surfaces of the copper foils 314. Although not shown, the photoetching resist layers 316 are then patterned through exposure by using glass plates having shielding areas as masks.

Figure 7B:
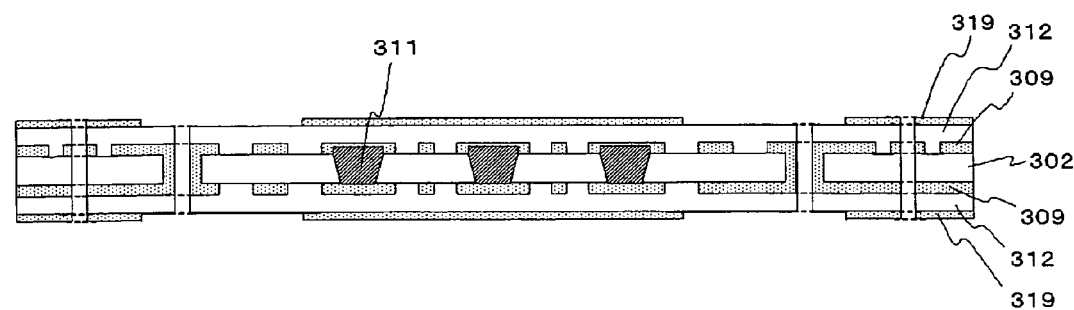

Then, as shown in FIG. 7B, the copper foils 314 are etched by using the photoetching resist layers 316 as masks. As a result, copper wiring 319 is formed. The wiring pattern can be formed, for example, by spraying a chemical etchant onto the areas exposed from the resist so that the unnecessary portions of the copper foils are etched off. After the etching, the photoetching resist layers 316 are removed.

Figure 8A:
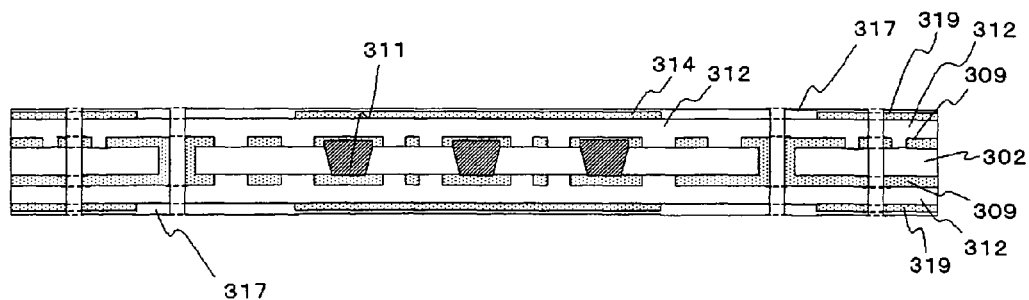
FIGS. 8A, 8B, and 8C are sectional views showing the steps of manufacturing the device mounting board according to the embodiment.

Next, as shown in FIG. 8A, photoetching resist layers 317 are laminated on the top and bottom surfaces of the wiring 319. Although not shown, the photoetching resist layers 317 are then patterned through exposure by using glass plates having shielding areas as masks.

Figure 8B:
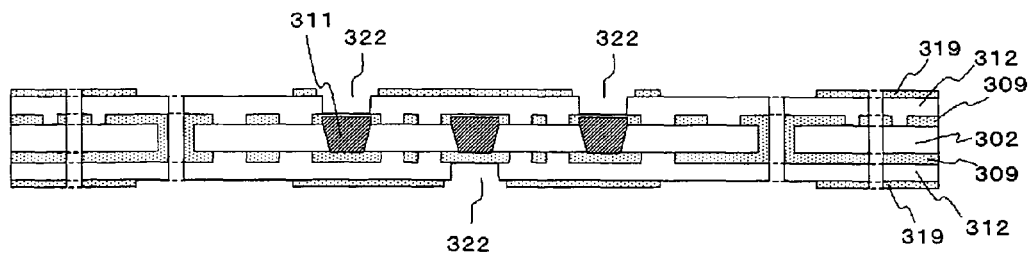

Subsequently, as shown in FIG. 8B, the wiring 319 and the insulating resin films 312 are patterned by using the photoetching resist layers 317 as masks. This forms via holes 322 having a diameter of around 150 µm, for example. After the patterning, the photoetching resist layers 317 are removed.

In the present embodiment, the via holes 322 are formed by solution-based chemical etching. Alternatively, other methods such as machining, plasma-based dry etching, and laser processing may be used.

Figure 8C:
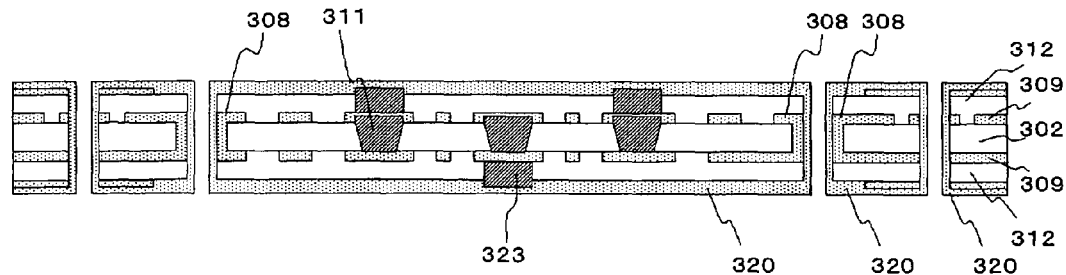

Next, as shown in FIG. 8C, the interiors of the via holes 322 are roughened and cleaned by wet processing. Subsequently, electroless plating capable of high aspect ratios is conducted, followed by electrolytic plating. This fills the via holes 322 with a conductive material, thereby forming the vias 323. Then, the copper film 320 is formed all over.

The vias 323 can be formed, for example, in the following manner. Initially, a thin film of around 0.5 to 1 µm is formed by electroless copper plating. Then, a film of approximately 20 µm or so is formed by electrolytic plating. The electroless plating often uses palladium as a catalyst. To make the electroless plating catalyst adhere to a flexible insulating resin, a palladium complex is mixed into an aqueous solution, and the flexible insulating substrate is immersed therein to make the palladium complex adhere to the surface. In that state, a reducing agent is added to reduce the complex into metal palladium, whereby the core for starting plating can be formed on the surface of the flexible insulating substrate.

Figure 9A:
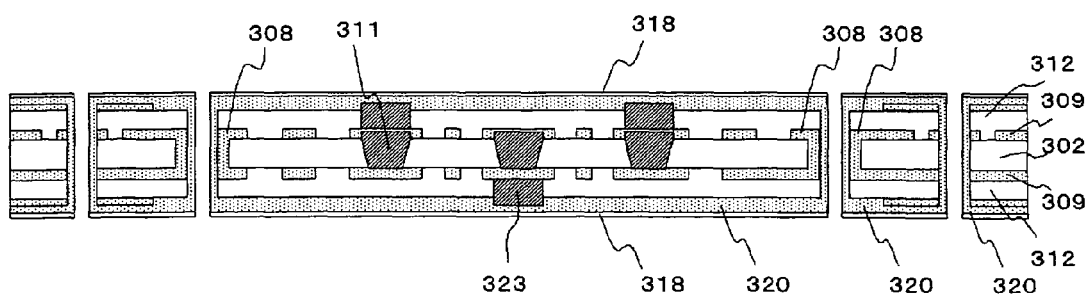
FIGS. 9A and 9B are sectional views showing the steps of manufacturing the device mounting board according to the embodiment.

As shown in FIG. 9A, photoetching resist layers 318 are laminated on the top and bottom surfaces of the copper film 320. Although not shown, the photoetching resist layers 318 are then patterned through exposure by using glass plates having shielding areas as masks.

Figure 9B:
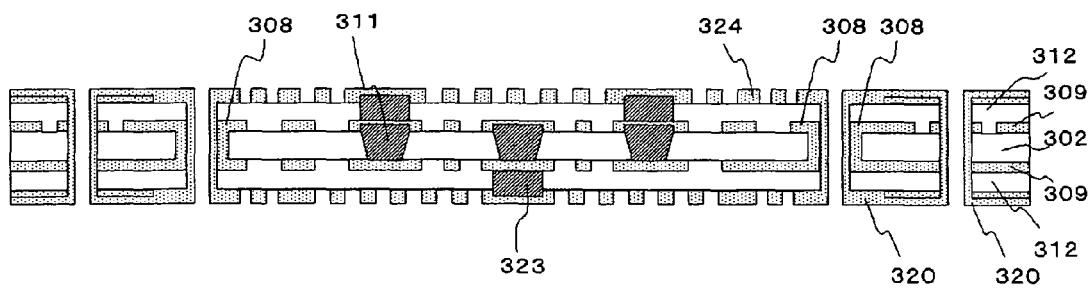

Subsequently, as shown in FIG. 9B, the copper film 320 is etched by using the photoetching resist layers 318 as masks. As a result, copper wiring 324 is formed. The wiring pattern can be formed, for example, by spraying a chemical etchant onto the areas exposed from the resist so that the unnecessary portions of the copper foils are etched off.

Then, as shown in FIG. 10A, photosolder resist layers 328 are laminated on the top and bottom surfaces of the wiring 324. The photosolder resist layers 328 contain a cardo type polymer, and have a thickness smaller than those of the insulating resin films 312.

As shown in FIG. 10B, the photosolder resist layers 328 are then patterned through exposure by using glass plates having shielding areas as masks. Subsequently, the wiring 324 is etched by using the photosolder resist layers 328 as masks, so that the vias 323 formed in the via holes 322 are exposed. This forms openings 326 having a diameter of around 150 µm, for example.

In the present embodiment, the openings 326 are formed by solution-based chemical etching. Alternatively, other methods such as machining, plasma-based dry etching, and laser processing may be used. Subsequently, the exposed vias 323 are plated with gold (not shown). Otherwise, solder balls may be formed directly on the exposed vias 323.

For ease of explanation, semiconductor devices have been omitted from the foregoing description. Nevertheless, semiconductor devices including LSI chips and IC chips are typically mounted on the surface of the four-layer ISB structure obtained above, by means of flip-chip connection or wire-bonding connection.

For comparison, description will hereinafter be given of the manufacturing steps for the case of using ordinary photosolder resist layers. When ordinary photosolder resist layers are used, the manufacturing steps shown in FIGS. 11A and 11B are conducted after the manufacturing steps shown in FIGS. 3A to 9B.

Figure 11A:
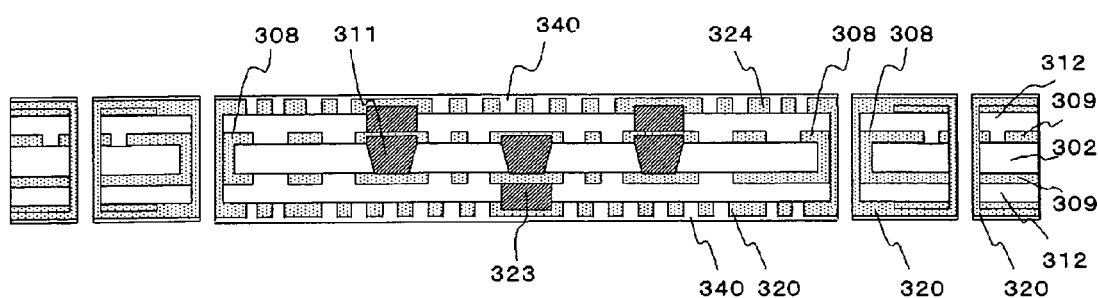
FIGS. 11A and 11B are sectional views showing the steps of manufacturing a device mounting board by using ordinary photosolder resist layers.

More specifically, when the ordinary photosolder resist layers are used, the manufacturing step shown in FIG. 9B is followed by the step of FIG. 11A. As shown in FIG. 11A, ordinary photosolder resist layers 340 are laminated to a thickness of approximately 35 µm on the top and bottom surfaces of the wiring 324. Otherwise, an ordinary photosolder resist solution may be applied by spin coating or the like, and dried to form the photosolder resist layers 340.

Figure 11B:
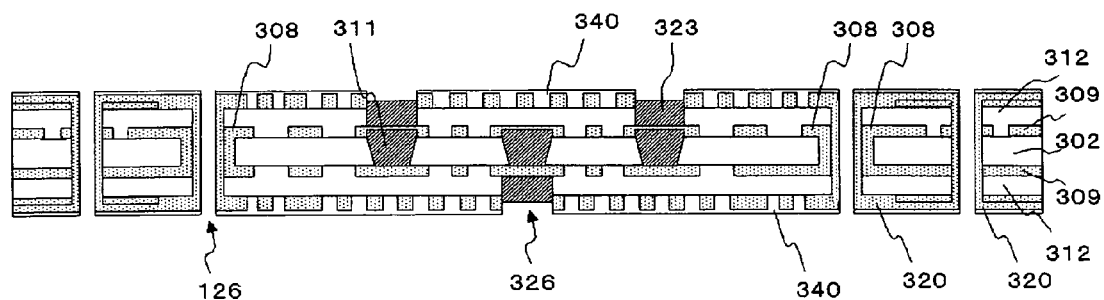
Figure 12:
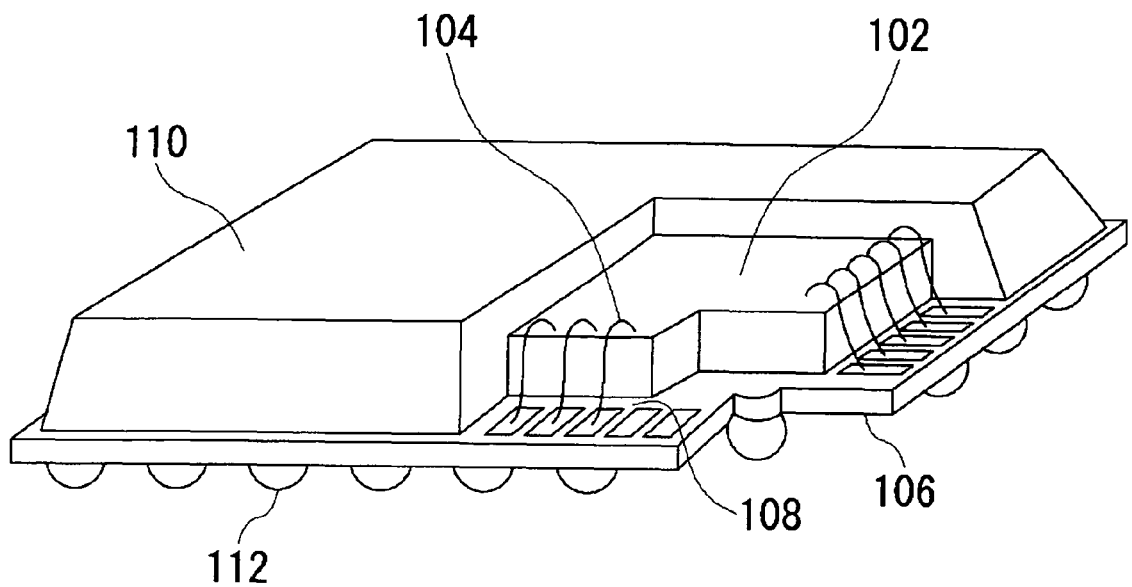
FIG. 12 is a diagram showing the general configuration of a conventional typical BGA.

As shown in FIG. 11B, the ordinary photosolder resist layers 340 are then patterned through exposure by using glass plates having shielding areas as masks. Subsequently, the wiring 324 is etched by using the ordinary photosolder resist layers 340 as masks, so that the vias 323 formed in the via holes 322 are exposed. This forms openings 326 having a diameter of around 150 μm, for example.

In these manufacturing steps, the openings 326 are formed by solution-based chemical etching. Alternatively, other methods such as machining, plasma-based dry etching, and laser processing may be used. Subsequently, the exposed vias 323 are plated with gold (not shown). Otherwise, solder balls may be formed directly on the exposed vias 323.

Hereinafter, description will be given of the effect of the present embodiment, or of using the insulating resin films which contain the cardo type polymer and are made of the resin material obtained through the addition of predetermined modifiers.

In the present embodiment, the photosolder resist layers 328 may be either of negative type and positive type. Negative type photosolder resist layers 328 are typically used, however, for situations where the foregoing cardo type polymer has both a carboxylic acid group and an acrylate group in the same molecular chain.

Specifically, the negative type photosolder resist layers 328 refer to insulating coatings made of a photosensitive resin that can cause a structural change in exposed areas alone so as to be insoluble in a particular solvent.

Since the photosolder resist layers 328 are intended for soldering, they require excellent durabilities such as high heat resistance and high elasticity. In the present embodiment, the excellent durabilities including high heat resistance and high elasticity are achieved through the use of the negative type photosolder resist layers 328 that contain a certain polymer to be described later.

Unlike ordinary photosolder resist layers which are formed by the application of a concentrate solution, the photosolder resist layers 328 of laminate type used in the present embodiment are formed by bonding photosolder resist layers of thin-film form. Here, the photosolder resist layers 328 are somewhat softened when bonded to the semiconductor substrate or the like at appropriate temperatures and pressures.

The material films of the laminate-type photosolder resist layers 328, yet to be bonded, are not limited to any particular thickness. For example, the material films may have a thickness of 5 μm or above, for example. Thicknesses of 10 μm and above are particularly preferable. Moreover, the laminate-type photosolder resist layers 328 formed by bonding the material films may have a thickness of 5 μm or above, for example. Thicknesses of 10 μm and above are particularly preferable. The material films or the laminate-type photosolder resist layers 328 having thicknesses in the foregoing range provide improved mechanical strength, reliability, and productivity.

The material films of the laminate-type photosolder resist layers 328, yet to be bonded, may have a thickness of 25 μm or below, for example. Thicknesses of 20 μm and below are particularly preferable. Moreover, the laminate-type photosolder resist layers 328 formed by bonding the material films may have a thickness of 25 μm or below, for example. Thicknesses of 20 μm and below are particularly preferable. The material films or the laminate-type photosolder resist layers 328 having thicknesses in the foregoing range improve the insulation performance of the laminate-type photosolder resist layers 328 and the surface flatness of the board.

As mentioned previously, the thickness of the laminate-type photosolder resist layers 328 is smaller than those of the insulating resin films 312. Nevertheless, as long as the thickness falls within the foregoing range, the material films containing the cardo type polymer of excellent resolution to be described later can be used to provide favorable workability as in photo-curing the photosolder resist layers 328 by UV irradiation.

As compared to the thicknesses of resin materials typically used for photosolder resist layers, or approximately 35 μm, the thickness of the photosolder resist layers 328 in the present embodiment is approximately 0.14 to 0.71 times. Moreover, as compared to the thicknesses of resin materials typically used for the insulating resin films 312 immediately below the photosolder resist layers, or approximately 35 to 50 μm, the thickness of the photosolder resist layers 328 in the present embodiment is approximately 0.1 to 0.71 times.

The thickness of the photosolder resist layers 328 may be rendered, for example, 30% or less with respect to that of the entire device mounting board. Thicknesses of 25% and less are particularly preferable. If the relative thickness of the laminate-type photosolder resist layers 328 falls in the foregoing range, the laminate-type photosolder resist layers 328 can be bonded with a small pressure. This makes it possible to suppress the stress on the entire device mounting board.

Incidentally, the laminate-type photosolder resist layers 328 containing the cardo type polymer typically show the desirable properties to be described later when they are cured in an after-baking step under appropriate conditions, separately from the foregoing exposure and developing steps.

Now, assume the case where the ordinary photosolder resist layers 340 as shown in FIGS. 11A and 11B are used. Here, the four-layer ISB can cause warpage because of differences between the wiring density, thickness, and material of the insulating resin films 312 lying immediately below the ordinary photosolder resist layers 340 and those of the substrate 302. The amount of warpage of the entire four-layer ISB tends to increase as the thicknesses of the respective layers of the four-layer ISB decrease.

In order to suppress the amount of warpage of the four-layer ISB described above, it is then required that the individual layers of the four-layer ISB be increased in thickness. As a result, it becomes difficult to reduce the thickness and size of the entire four-layer ISB.

When no measure is taken to suppress the amount of warpage of the four-layer ISB described above, the four-layer ISB deteriorates in flatness. This can cause poor contact when the four-layer ISB is connected to a wiring board in a flip-chip fashion or the like.

In contract, the four-layer ISB of the present embodiment uses the cardo type polymer which has excellent resolution and rigidity as will be described later. The photosolder resist layers 328 can thus be made thinner than the insulating resin films 312 without a drop in resolution. It is therefore possible to reduce the thickness of the entire four-layer ISB while suppressing the amount of warpage of the entire four-layer ISB ascribable to the differences between the wiring density, thickness, and material of the insulating resin films 312 immediately below the photosolder resist layers and those of the substrate 302.

In addition, the foregoing resin material has moisture absorption characteristics superior to those of conventional materials, and can thus improve the adhesiveness between the photosolder resist layers 328 and the adjoining members. As a result, it is possible to provide a four-layer ISB of higher device reliability and higher integration.

Since the four-layer ISB has excellent flatness, it can be connected to a wiring board by a flip-chip connection or the like with favorable contact. Semiconductor devices can also be connected thereto by a flip-chip connection or the like with favorable contact. Consequently, the four-layer ISB of the present embodiment can be used to provide a semiconductor apparatus of lower profile, smaller size, and higher reliability.

Incidentally, the cardo type polymer having a certain structure to be described later is effective at achieving these laminate-type photosolder resist layers 328 which are thinner than ordinary laminate-type photosolder resist layers. The reason is that the cardo type polymer to be described later has favorable workability and rigidity, and thus is capable of forming material films having excellent insulation performance with a smaller thickness than the ordinary ones.

The foregoing photosolder resist layers 328 may contain the cardo type polymer. The cardo type polymer is a generic name for polymers which have the structure that cyclic groups are bonded directly to the main chains of the polymers, as expressed by the formula (I):

(CHEMICAL FORMULA I)

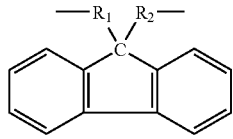

In the formula (I), $R_1$ and $R_2$ represent bivalent groups such as an alkylene group and a group containing an aromatic ring.

That is, this cardo type polymer refers to a polymer having the structure that its bulky substituents having quaternary carbon lie at near right angles to the main chain.

Here, the cyclic portions may include a saturated bond or an unsaturated bond. Such atoms as nitrogen atom, oxygen atom, sulfur atom, and phosphor atom may also be included aside from carbon. The cyclic portions may be polycyclic or condensed rings. Moreover, the cyclic portions may be bonded with other carbon chains, or even be cross-linked.

Examples of the bulky substituents include cyclic groups such as a fluorenyl group. The fluorenyl group has a condensed ring having the structure that six-member rings are bonded to both sides of a five-member ring, and the remaining one carbon atom of the five-member ring is bonded to the main chain, as expressed by the formula (II):

(CHEMICAL FORMULA II)

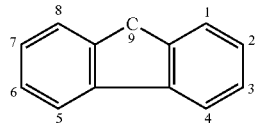

The fluorenyl group is one in which the carbon atom at position 9 of fluorene is dehydrogenated. In the cardo type polymer, as shown by the formula (I), the carbon atom of an alkyl group or the main chain bonds to the position of the dehydrogenated carbon atom.

Having the foregoing structure, the cardo type polymer provides the following effects:
(1) Restraining rotation of the polymer main chain;
(2) Restricting conformation of the main and side chains;
(3) Inhibiting intermolecular packing; and
(4) Increasing aromaticity by such means as introduction of aromatic substituents to the side chain.

Consequently, the cardo type polymer has the characteristics of high heat resistance, solvent solubility, high transparency, a high index of refraction, a low index of birefringence, and even a higher gas permeability.

Here, the yet-to-be-bonded material films of the laminate-type photosolder resist layers 328 may be formed as thick films of the cardo type polymer with predetermined additives so that the occurrence of voids, unevenness, and the like are suppressed. Moreover, since the cardo type polymer has a high glass transition temperature, the material films containing the cardo type polymer can contain large amounts of other components having high fluidity. The material films containing the cardo type polymer have an excellent capability for filing since the materials thereof can be easily softened by heat. The laminate-type photosolder resist layers 328 bonded to the device mounting board thus do not have much voids or unevenness. Then, the laminate-type photosolder resist layers 328 having fewer voids can be used to ensure film thicknesses.

Here, ordinary photosolder resist layers may cause warpage when formed in smaller thicknesses. In contrast, the present embodiment uses the material films containing the cardo type polymer that has excellent rigidity, excellent resolution, and low coefficients of thermal expansion as will be described later. The laminate-type photosolder resist layers 328 can thus be formed in smaller thicknesses along with excellent resolution.

Incidentally, the foregoing cardo type polymer may be a cross-linked polymer having a carboxylic acid group and an acrylate group in the same molecular chain. Conventional photosensitive varnishes have typically been made of a blend of an oligomer that contains a developable carboxylic acid group, and a multifunctional acryl. These photosensitive varnishes have been susceptible to further improvement in terms of resolution. The cardo type polymer made of the cross-linked polymer having a carboxylic acid group and an acrylate group in the same molecular chain can be used instead of the typical photosensitive varnishes, with the advantage that the photosolder resist layers 328 containing the cardo type polymer improve in resolution. The reason is that the cardo type polymer has the developable carboxylic acid group and the acrylate group, or the cross-linker group, in the same molecular chain, has bulky substituents in the main chain, and thus is less prone to radical diffusion.

Now, the photosolder resist layers 328 made of the cardo type polymer containing resin film described above desirably satisfy the following property values. Incidentally, the following property values are for resin portions containing no filler or the like. The values may be adjusted as appropriate when fillers and the like are added therein.

The cardo type polymer containing resin film may have a glass transition temperature (Tg) of 180° C. or above, for example. Glass transition temperatures of 190° C. and above are particularly preferable. The glass transition temperatures in this range improve the heat resistance of the cardo type polymer containing resin film.

The cardo type polymer containing resin film may have a glass transition temperature (Tg) of 220° C. or below, for example. Glass transition temperatures of 210° C. and below are particularly preferable. In this range of glass transition temperatures, the cardo type polymer containing resin film can be manufactured stably by ordinary processes. The glass transition temperature can be measured, for example, by a dynamic viscoelastic analysis (DMA) on a bulk sample.

At temperatures no higher than Tg, the cardo type polymer containing resin film may have a coefficient of thermal expansion (CTE) of 80 ppm/° C. or below, for example. Coefficients of thermal expansion of 75 ppm/° C. and below are particularly preferable. The coefficients of thermal expansion in this range improve the adhesiveness between the cardo type polymer containing resin film and other members.

At temperatures no higher than Tg, the cardo type polymer containing resin film may have a coefficient of thermal expansion (CTE) of 50 ppm/° C. or above, for example. Coefficients of thermal expansion of 55 ppm/° C. and above are particularly preferable. When fillers are blended into the cardo type polymer containing resin film described above, it is possible to obtain a resin composition having a CTE of 20 ppm/° C. or below. In this range of coefficients of thermal expansion, the cardo type polymer containing resin film can be manufactured stably by ordinary processes. The coefficient of thermal expansion can be measured, for example, by a thermal expansion analysis using a thermomechanical analyzer (TMA).

The cardo type polymer containing resin film may have a thermal conductivity of 0.50 W/cm$^2$·sec or below, for example. Thermal conductivities of 0.35 W/cm$^2$·sec and below are particularly preferable. The thermal conductivities in this range improve the heat resistance of the cardo type polymer containing resin film.

The cardo type polymer containing resin film may have a thermal conductivity of 0.10 W/cm$^2$·sec or above, for example. Thermal conductivities of 0.25 W/cm$^2$·sec and above are particularly preferable. In this range of thermal conductivities, the cardo type polymer containing resin film can be manufactured stably by ordinary processes. The thermal conductivity can be measured, for example, by a disk heat flow meter method (ASTM E1530).

When the cardo type polymer containing resin film has vias of 10 to 200 μm in diameter, the via aspect ratio may range from 0.025 to 2.5, for example. Via aspect ratios of 0.5 to 1.5 are particularly preferable. The via aspect ratios in this range improve the resolution of the cardo type polymer containing resin film.

Moreover, in this range of via aspect ratios, the cardo type polymer containing resin film can be manufactured stably by ordinary processes.

The cardo type polymer containing resin film may have a permittivity of 4 or below, for example, when an alternating electric field having a frequency of 1 MHz is applied thereto. Permittivities of 3 and below are particularly preferable. The permittivities in this range improve the dielectric characteristics of the cardo type polymer containing resin film, including high-frequency characteristics.

The cardo type polymer containing resin film may have a permittivity of 0.1 or above, for example, when an alternating electric field having a frequency of 1 MHz is applied thereto. Permittivities of 2.7 and above are particularly preferable. In this range of permittivities, the cardo type polymer containing resin film can be manufactured stably by ordinary processes.

The cardo type polymer containing resin film may have a dielectric loss tangent of 0.04 or below, for example, when an alternating electric field having a frequency of 1 MHz is applied thereto. Dielectric loss tangents of 0.029 and below are particularly preferable. The dielectric loss tangents in this range improve the dielectric characteristics of the cardo type polymer containing resin film, including high-frequency characteristics.

The cardo type polymer containing resin film may have a dielectric loss tangent of 0.001 or above, for example, when an alternating electric field having a frequency of 1 MHz is applied thereto. Dielectric loss tangents of 0.027 and above are particularly preferable. In this range of dielectric loss tangents, the cardo type polymer containing resin film can be manufactured stably by ordinary processes.

The cardo type polymer containing resin film may have a moisture absorption ratio of 3% or below by weight for 24 hours, for example. Moisture absorption ratios of 1.5% and below by weight are particularly preferable. The 24-hour moisture absorption ratios (% by weight) in this range improve the moisture resistance of the cardo type polymer containing resin film.

The cardo type polymer containing resin film may have a moisture absorption ratio of 0.5% or above by weight for 24 hours, for example. Moisture absorption ratios of 1.3% and above by weight are particularly preferable. In this range of moisture absorption ratios (% by weight) for 24 hours, the cardo type polymer containing resin film can be manufactured stably by ordinary processes.

When the cardo type polymer satisfies the plurality of properties mentioned above, various characteristic required of the laminate-type photosolder resist layers 328 containing the cardo type polymer are achieved in a well-balanced manner. The characteristics require include mechanical strength, heat resistance, adhesiveness with other members, resolution, dielectric characteristics, and moisture resistance. Consequently, it is possible to stably provide a device mounting board which has high reliability and heat resistance and provides excellent position accuracy in mounting semiconductor devices.

Embodiment 2

FIGS. 13A to 13D are sectional views schematically showing various types of semiconductor apparatuses which are formed by mounting a semiconductor device(s) on the semiconductor mounting board described in the embodiment 1.

There are various modes of semiconductor apparatuses having a semiconductor device(s) mounted on the device mounting board described in the foregoing embodiment 1. For example, in some modes, semiconductor devices are mounted by flip-chip connection or wire-bonding connection. In some modes, semiconductor devices are mounted on the device mounting board in a face-up structure or a face-down structure. In some modes, semiconductor devices are mounted on either one or both of the sides of the device mounting board. Moreover, these various modes may be combined.

Figure 13A:
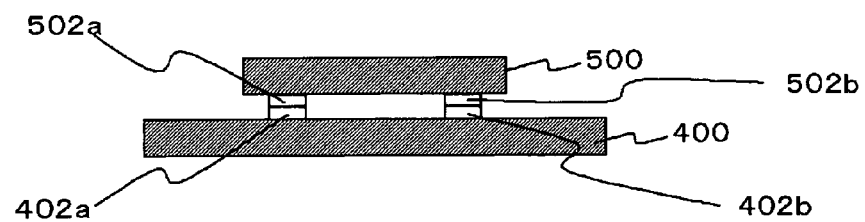
FIGS. 13A, 13B, 13C, and 13D are sectional views schematically showing various types of semiconductor apparatuses which are formed by mounting a semiconductor device(s) on the device mounting board according to the embodiment.

Specifically, for example, a semiconductor device 500 such as an LSI may be mounted on the top of the device mounting board 400 of the embodiment 1 in a flip-chip fashion as shown in FIG. 13A. Here, electrode pads 402a and 402b on the top surface of the device mounting board 400 are directly connected to electrode pads 502a and 502b of the semiconductor device 500, respectively.

Figure 13B:
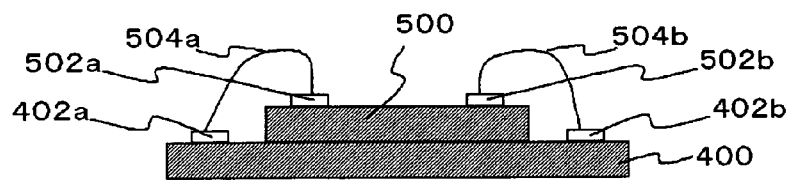

As shown in FIG. 13B, the semiconductor device 500 such as an LSI may also be mounted on the top of the device mounting board 400 in a face-up structure. Here, the electrode pads 402a and 402b on the top surface of the device mounting board 400 are wire-bonded to the electrode pads 502a and 502b on the top surface of the semiconductor device 500 by gold wires 504a and 504b, respectively.

Figure 13C:
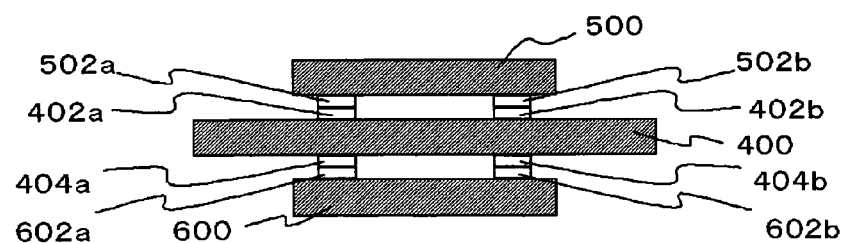

As shown in FIG. 13C, the semiconductor device 500 such as an LSI may be mounted on the top of the device mounting board 400 in a flip-chip fashion while a semiconductor device 600 such as an IC is mounted on the bottom of the device mounting board 400 in a flip-ship fashion. Here, the electrode pads 402a and 402b on the top surface of the device mounting board 400 are directly connected to the electrode pads 502a and 502b of the semiconductor device 500, respectively. Moreover, electrode pads 404a and 404b on the bottom surface of the device mounting board 400 are directly connected to electrode pads 602a and 602b of the semiconductor device 600, respectively.

Figure 13D:
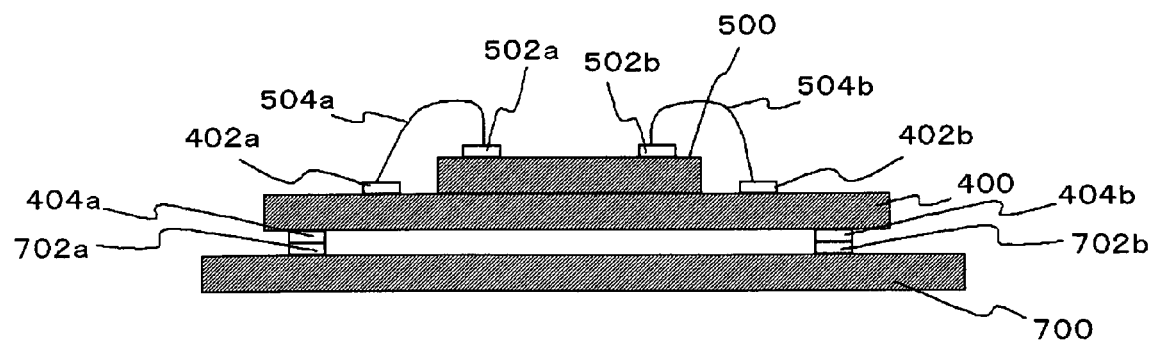

As shown in FIG. 13D, the semiconductor device 500 such as an LSI may be mounted on the top of the device mounting board 400 in a face-up structure while the device mounting board 400 is mounted on the top of a printed wiring board 700. Here, the electrode pads 402a and 402b on the top surface of the device mounting board 400 are wire-bonded to the electrode pads 502a and 502b on the top surface of the semiconductor device 500 by gold wires 504a and 504b, respectively. In addition, the electrode pads 404a and 404b on the bottom surface of the device mounting board 400 are directly connected to electrode pads 702a and 702b on the top surface of the printed wiring board 700, respectively.

In any of the semiconductor apparatuses of the foregoing structures, the first insulating layers of the device mounting board 400, containing the cardo type polymer, have a thickness smaller than the second insulating layers as described in the embodiment 1. This configuration allows a reduction in the thickness and size of the semiconductor apparatus while the first insulating layers fix the entire multilayer insulating film and suppress warpage of the entire multilayer insulating film of the device mounting board 400.

Consequently, the semiconductor devices 500 and 600 can be mounted on the top and/or bottom surface(s) of the device mounting board 400 with excellent position accuracy. In addition, the device mounting board 400 can also be mounted on the printed wiring board 700 with excellent position accuracy. Such excellent positional accuracies can be obtained both in flip-chip connection and in wire-bonding connection as well.

Up to this point, description has been given of the configurations of the present invention. Any combinations of these configurations are also intended to constitute applicable aspects of the present invention. Moreover, any conversions of the expressions of the present invention into other categories are also intended to constitute applicable aspects of the present invention.

For example, the foregoing embodiments have dealt with the configurations where the photosolder resist layers 328 are made of the resin material that contains the cardo type polymer along with predetermined modifier additives. Nevertheless, the cardo type polymer may be contained in the substrate 302 and/or the insulating resin films 312 constituting the four-layer ISB.

While the foregoing device mounting board is one having a four-layer ISB™ structure, it is not particularly limited to this example. The multilayer insulating film of the foregoing device mounting board may be a two-layer insulating film or a three-layer insulating film, or even an insulating film having five or more layers.

The cardo type polymer may also be used for substrates, insulating resin films, photosolder resist layers, and the like which constitutes ISBs other than the four-layer ISB. Furthermore, the cardo type polymer may be used for substrates, insulating resin films, photosolder resist layers, and the like of other semiconductor packages.

The foregoing multilayer wiring structure is not limited to copper wiring. For example, aluminum wiring, aluminum alloy wiring, copper alloy wiring, wire-bonded gold wiring, gold alloy wiring, or wiring made of a mixture of these may also be used.

Active devices such as a transistor and a diode, and passive devices such as a capacitor and a resistor, may also be arranged inside of or on the surface of the foregoing device mounting board. The provision of such devices allows still higher integration of the semiconductor apparatus.

While the foregoing device mounting board is one having an ISB structure, it is not particularly limited to this example. For example, the device mounting board according to the embodiments may be used as a so-called printed wiring board.

What is claimed is:

1. A device mounting board for a device to be mounted on, comprising:
   a substrate; and
   a laminated film composed of a plurality of insulating layers formed on one side of the substrate, wherein
   any of second and subsequent insulating layers from the substrate contains a cardo type polymer, and
   the insulating layer containing the cardo type polymer has a thickness smaller than that of the insulating layer that includes an insulating resin other than the cardo type polymer and that is arranged between the insulating layer containing the cardo type polymer and the substrate.

2. The device mounting board according to claim 1, wherein
   the insulating layer containing the cardo type polymer is an insulating layer for a conductive member to be embedded in.

3. The device mounting board according to claim 1, wherein
   the insulating layer containing the cardo type polymer is a solder resist layer.

4. The device mounting board according to claim 2, wherein
   the insulating layer containing the cardo type polymer is a solder resist layer.

5. The device mounting board according to claim 1, wherein
   the cardo type polymer is formed by cross-linking a polymer having a carboxylic acid group and an acrylate group in a same molecular chain.

6. The device mounting board according to claim 2, wherein
   the cardo type polymer is formed by cross-linking a polymer having a carboxylic acid group and an acrylate group in a same molecular chain.

7. The device mounting board according to claim 3, wherein
   the cardo type polymer is formed by cross-linking a polymer having a carboxylic acid group and an acrylate group in a same molecular chain.

8. The device mounting board according to claim 4, wherein
   the cardo type polymer is formed by cross-linking a polymer having a carboxylic acid group and an acrylate group in a same molecular chain.

9. The device mounting board according to claim 1, wherein:
   the insulating layer containing the cardo type polymer has a glass transition temperature in the range of 180° C. to 220° C.; and
   the insulating layer containing the cardo type polymer has a dielectric loss tangent in the range of 0.001 to 0.04 when an alternating electric field having a frequency of 1 MHz is applied thereto.

10. The device mounting board according to claim 2, wherein:
    the insulating layer containing the cardo type polymer has a glass transition temperature in the range of 180° C. to 220° C.; and the insulating layer containing the cardo type polymer has a dielectric loss tangent in the range of 0.001 to 0.04 when an alternating electric field having a frequency of 1 MHz is applied thereto.

11. The device mounting board according to claim 3, wherein:
the insulating layer containing the cardo type polymer has a glass transition temperature in the range of 180° C. to 220° C.; and
the insulating layer containing the cardo type polymer has a dielectric loss tangent in the range of 0.001 to 0.04 when an alternating electric field having a frequency of 1 MHz is applied thereto.

12. The device mounting board according to claim 9, wherein
the insulating layer containing the cardo type polymer has a coefficient of thermal expansion in the range of 50 to 80 ppm/° C. at temperatures no higher than the glass transition temperature of the insulating layer.

13. The device mounting board according to claim 10, wherein
the insulating layer containing the cardo type polymer has a coefficient of thermal expansion in the range of 50 to 80 ppm/° C. at temperatures no higher than the glass transition temperature of the insulating layer.

14. The device mounting board according to claim 11, wherein
the insulating layer containing the cardo type polymer has a coefficient of thermal expansion in the range of 50 to 80 ppm/° C. at temperatures no higher than the glass transition temperature of the insulating layer.

15. The device mounting board according to claim 1, further comprising
a second laminated film composed of a plurality of insulating layers formed on the other side of the substrate, and wherein
in the second laminated film:
any of second and subsequent insulating layers from the substrate contains a cardo type polymer; and
the insulating layer containing the cardo type polymer has a thickness smaller than that of the insulating layer that includes an insulating resin other than the cardo type polymer and that is arranged between the insulating layer that includes an insulating containing the cardo type polymer and the substrate.

16. The device mounting board according to claim 2, further comprising
a second laminated film composed of a plurality of insulating layers formed on the other side of the substrate, and wherein
in the second laminated film:
any of second and subsequent insulating layers from the substrate contains a cardo type polymer; and
the insulating layer containing the cardo type polymer has a thickness smaller than that of the insulating layer that includes an insulating resin other than the cardo type polymer and that is arranged between the insulating layer containing the cardo type polymer and the substrate.

17. The device mounting board according to claim 3, further comprising
a second laminated film composed of a plurality of insulating layers formed on the other side of the substrate, and wherein
in the second laminated film:
any of second and subsequent insulating layers from the substrate contains a cardo type polymer; and
the insulating layer containing the cardo type polymer has a thickness smaller than that of the insulating layer that includes an insulating resin other than the cardo type polymer and that is arranged between the insulating layer containing the cardo type polymer and the substrate.

18. A semiconductor apparatus comprising:
the device mounting board according to claim 1; and
a semiconductor device mounted on the device mounting board.

19. A semiconductor apparatus comprising:
the device mounting board according to claim 2; and
a semiconductor device mounted on the device mounting board.

20. A semiconductor apparatus comprising:
the device mounting board according to claim 3; and
a semiconductor device mounted on the device mounting board.

* * * * *